United States Patent
Satoh

(10) Patent No.: US 10,153,142 B2
(45) Date of Patent: Dec. 11, 2018

(54) LICOO$_2$ SPUTTERING TARGET, PRODUCTION METHOD THEREFOR, AND POSITIVE ELECTRODE MATERIAL THIN FILM

(71) Applicant: JX Nippon Mining & Metals Corporation, Tokyo (JP)

(72) Inventor: Kazuyuki Satoh, Ibaraki (JP)

(73) Assignee: JX Nippon Mining & Metals Corporation, Tokyo (JP)

( * ) Notice: Subject to any disclaimer, the term of this patent is extended or adjusted under 35 U.S.C. 154(b) by 0 days.

(21) Appl. No.: 15/127,461

(22) PCT Filed: Mar. 10, 2015

(86) PCT No.: PCT/JP2015/057004
§ 371 (c)(1),
(2) Date: Sep. 20, 2016

(87) PCT Pub. No.: WO2015/146574
PCT Pub. Date: Oct. 1, 2015

(65) Prior Publication Data
US 2017/0148614 A1    May 25, 2017

(30) Foreign Application Priority Data

Mar. 26, 2014 (JP) ................. 2014-063181

(51) Int. Cl.
*H01J 37/34* (2006.01)
*C23C 14/34* (2006.01)
(Continued)

(52) U.S. Cl.
CPC .......... *H01J 37/3426* (2013.01); *C01G 51/04* (2013.01); *C04B 35/01* (2013.01); *C04B 35/62685* (2013.01); *C04B 35/645* (2013.01); *C23C 14/08* (2013.01); *C23C 14/083* (2013.01); *C23C 14/3414* (2013.01); *H01J 37/3429* (2013.01); *H01M 4/0426* (2013.01); *H01M 4/131* (2013.01); *H01M 4/525* (2013.01);
(Continued)

(58) Field of Classification Search
CPC .............. H01J 37/3426; H01J 37/3429; C23C 14/3414; C23C 14/08; C23C 14/083; C04B 2235/3203; H01M 4/131; H01M 4/525; H01M 4/0426; H01M 10/0525; H01M 10/0562
See application file for complete search history.

(56) References Cited

U.S. PATENT DOCUMENTS 6,497,854 B2  12/2002 Kohiro et al.
7,288,242 B2  10/2007 Tasaki et al.
(Continued)

FOREIGN PATENT DOCUMENTS

JP    H04-137317 A    5/1992
WO    2014/142197 A1   9/2014

*Primary Examiner* — Michael A Band
(74) *Attorney, Agent, or Firm* — Howson & Howson LLP

(57) ABSTRACT

A sputtering target having a composition of LiCoO$_2$, wherein a resistivity of the target is 100 Ωcm or less, and a relative density is 80% or higher. The sputtering target of the present invention is effective for use in forming a positive electrode thin film in all-solid-state thin-film lithium ion secondary batteries equipped in vehicles, information and communication electronics, household appliances, and the like.

3 Claims, 1 Drawing Sheet

(51) Int. Cl.
     *C23C 14/08*     (2006.01)
     *C04B 35/01*     (2006.01)
     *C04B 35/626*    (2006.01)
     *C04B 35/645*    (2006.01)
     *H01M 4/131*     (2010.01)
     *H01M 4/525*     (2010.01)
     *H01M 4/04*      (2006.01)
     *H01M 10/0525*   (2010.01)
     *H01M 10/0562*   (2010.01)
     *C01G 51/04*     (2006.01)

(52) U.S. Cl.
     CPC ... *H01M 10/0525* (2013.01); *H01M 10/0562* (2013.01); *C01P 2002/70* (2013.01); *C01P 2006/42* (2013.01); *C04B 2235/3203* (2013.01); *C04B 2235/3275* (2013.01); *C04B 2235/44* (2013.01); *C04B 2235/442* (2013.01); *C04B 2235/604* (2013.01); *C04B 2235/656* (2013.01); *C04B 2235/6567* (2013.01); *C04B 2235/6585* (2013.01); *C04B 2235/662* (2013.01); *C04B 2235/663* (2013.01); *C04B 2235/77* (2013.01); *C04B 2235/81* (2013.01); *Y02E 60/122* (2013.01); *Y02P 70/54* (2015.11)

(56) References Cited

U.S. PATENT DOCUMENTS

| | | |
|---|---|---|
| 8,062,486 B2 | 11/2011 | Nagase et al. |
| 9,059,465 B2 | 6/2015 | Nagase et al. |
| 9,136,533 B2 | 9/2015 | Nagase et al. |
| 2005/0265909 A1 | 12/2005 | Kajiya et al. |
| 2006/0121350 A1 | 6/2006 | Kajiya et al. |
| 2011/0065002 A1 | 3/2011 | Nagase |
| 2012/0305391 A1 | 12/2012 | Kim et al. |
| 2012/0305392 A1 | 12/2012 | Kim et al. |
| 2015/0014157 A1 | 1/2015 | Taketomi et al. |
| 2015/0376773 A1 | 12/2015 | Taketomi et al. |

[Fig. 1]
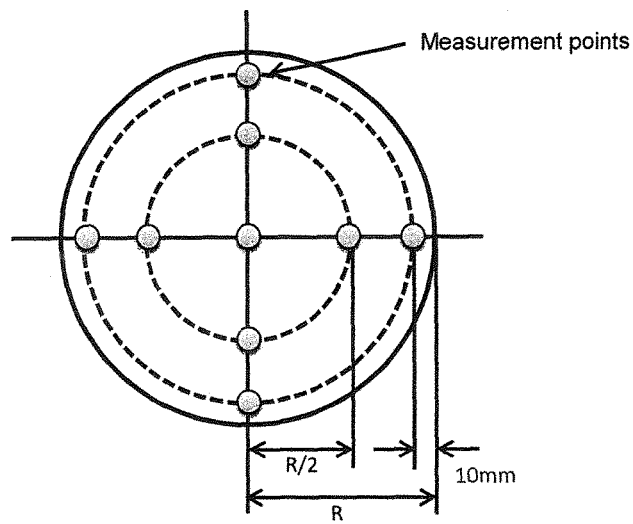
[Fig. 2]
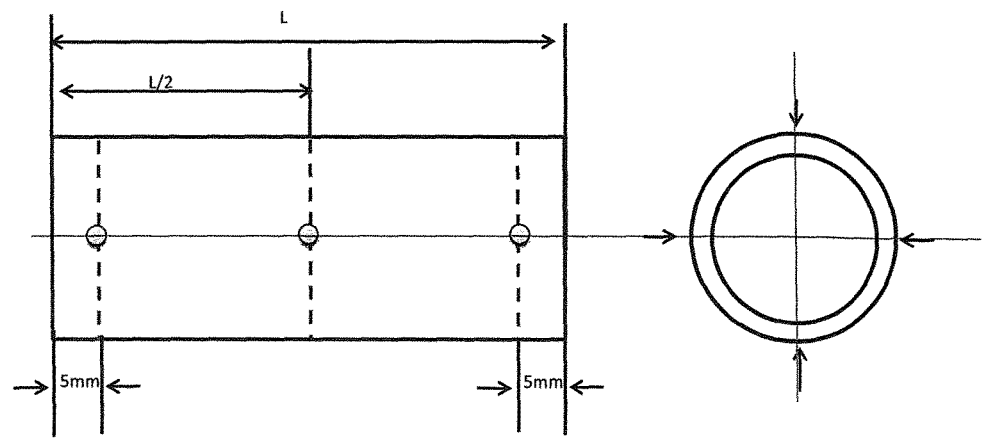

LICOO₂ SPUTTERING TARGET, PRODUCTION METHOD THEREFOR, AND POSITIVE ELECTRODE MATERIAL THIN FILM

BACKGROUND

The present invention relates to a sputtering target for use in forming a positive electrode thin film in all-solid-state thin-film lithium ion secondary batteries, a method of producing such a sputtering target, and a positive electrode thin film produced from such a sputtering target.

A lithium ion secondary battery is attracting attention as a secondary battery with high output and large capacity, and various types of research and development are being actively pursued. The electrodes and electrolytes configuring the lithium ion secondary battery face a host of challenges that need to be researched from the perspective of energy density, charging/discharging characteristics, manufacturing process, cost of materials and so on. Under these circumstances, an all-solid-state lithium ion battery in which liquid electrolytes, which are combustible and may cause fires due to a liquid spill, are replaced with solid electrolytes, is attracting attention.

Generally speaking, solid electrolytes have an ion conductance that is a few orders of magnitude lower in comparison to liquid electrolytes, and this is a major impediment in the practical application of an all-solid-state lithium ion battery. Today, numerous research institutions and corporations are actively developing materials centering on solid electrolytes having high ionic conductivity. In recent years, an all-solid-state thin-film lithium ion secondary battery, which resolves the drawback of having low ionic conductivity by producing the solid electrolytes in the form of thin films, has been developed and placed on the market.

An all-solid-state thin-film battery is characterized in that it is thin and can be miniaturized, does not deteriorate easily, and is free from any liquid spill. The positive electrode materials and solid electrolyte films configuring this kind of thin-film lithium ion battery are prepared via the sputtering method. The present applicant previously provided a technology related to a target configured from lithium-containing transition metal oxides for forming thin-film positive electrodes for use in a thin-film lithium ion battery (Patent Document 1).

Since the foregoing positive electrode thin film is generally thick even among the materials in the thin-film lithium ion battery and takes much time to be deposited, it is desired to be formed via high speed deposition. Nevertheless, since a conventional target material that was used for forming positive electrode thin films had a high resistivity (1 to 500 kΩ or higher), it was difficult to perform DC sputtering which enables high speed deposition, and RF sputtering or the like is normally performed.

CITATION LIST

Patent Documents

[Patent Document 1] International Publication No. 2008/012970
[Patent Document 2] International Publication No. 2011/086649
[Patent Document 3] International Publication No. 2011/086650

SUMMARY

An object of the present invention is to provide a sputtering target for use in forming a LiCoO₂ thin film as a positive electrode material of a lithium ion secondary battery, a method of producing such a sputtering target, and a positive electrode thin film produced from such a sputtering target, and particularly to provide a sputtering target capable of stably and efficiently depositing uniform LiCoO₂ positive electrode thin films at a high speed.

In order to achieve the foregoing object, as a result of intense study, the present inventors discovered that it is possible to obtain a sputtering target having low resistivity and high density by devising the sintering conditions and heat treatment conditions in the production process of the LiCoO₂ sputtering target. Based on the foregoing discovery, the present inventors provide the following invention.

1) A LiCoO₂ sputtering target having a composition of LiCoO₂, wherein an average resistivity of a target surface (measured with four-terminal method) is 100 Ωcm or less, and a relative density is 80% or higher.

2) The LiCoO₂ sputtering target according to 1) above, wherein the relative density is 85% or higher.

3) The LiCoO₂ sputtering target according to 1) or 2) above, wherein the average resistivity of the target surface (measured with four-terminal method) is 50 Ωcm or less.

4) The LiCoO₂ sputtering target according to any one of 1) to 3) above, wherein an in-plane maximum resistivity of the target is not greater than double the average resistivity of the target surface.

5) The LiCoO₂ sputtering target according to any one of 1) to 4) above, wherein an average resistivity of a position corresponding to half the thickness of the target is not greater than double the average resistivity of the target surface.

6) A positive electrode thin film formed by using the sputtering target according to any one of 1) to 5) above.

7) A method of producing a LiCoO₂ sputtering target, comprising hot pressing a lithium cobalt oxide powder at 600 to 950° C., and thereafter performing heat treatment at 950 to 1150° C. in an atmosphere or in an oxygen atmosphere to produce a target.

8) A method of producing a LiCoO₂ sputtering target, comprising subjecting a lithium cobalt oxide powder to pressure molding, and thereafter performing heat treatment to the resultant molded article at 950 to 1150° C. in an atmosphere or in an oxygen atmosphere to produce a target.

9) A method of producing a LiCoO₂ sputtering target, comprising subjecting a lithium cobalt oxide powder to cold isostatic press to be molded into a cylindrical shape, and thereafter performing heat treatment to the resultant molded article at 950 to 1150° C. in an atmosphere or in an oxygen atmosphere to produce a cylindrical target.

10) The method of producing a LiCoO₂ sputtering target according to any one of 7) to 9) above, wherein, in the heat treatment process, heat treatment is repeated two or more times, temperature of final heat treatment is set to be 950 to 1150° C., and temperature of any preceding heat treatment is set to be a temperature that is not higher than the temperature of the final heat treatment.

Since the sputtering target for forming a positive electrode thin film of the present invention, which is used for the production of all-solid-state thin-film lithium ion secondary batteries, has a low resistivity and can be subject to DC sputtering, the present invention yields a superior effect of being able to deposit a uniform positive electrode thin film at a high speed. Moreover, since the sputtering target of the present invention has a high density, there is minimal generation of abnormal discharge (arcing) during deposition, and the present invention yields a superior effect of being able to thereby deposit a uniform positive electrode thin film. Furthermore, all-solid-state thin-film lithium ion secondary batteries with this kind of positive electrode thin film yield an effect of being able to obtain stable charging/discharging characteristics.

BRIEF DESCRIPTION OF DRAWINGS

FIG. 1 This is a schematic diagram showing the points of measurement of the resistance value of a disk-shaped sputtering target.

FIG. 2 This is a schematic diagram showing the points of measurement of the resistance value of a cylindrical sputtering target.

DETAILED DESCRIPTION

Since a positive electrode thin film in a thin-film lithium ion secondary battery is relatively thick even among the materials in the thin-film battery, it is desirable to adopt the DC sputtering method having a fast deposition rate as the deposition method from the perspective of improving the productivity. Nevertheless, since the resistivity of a high density $LiCoO_2$ sputtering target is high at 1 to 500 kΩ as described above, normally the RF sputtering is adopted. Since the deposition rate of this RF sputtering is slow, it takes much time to increase the film thickness in order to increase the battery capacity, and there is a problem in that the productivity will deteriorate. Thus, a special sputtering method that combines RF sputtering and DC sputtering by using a target having a relatively low resistivity has also been adopted, but in the foregoing case, there is a problem in that the manufacturing process and equipment would become complex.

$LiCoO_2$ may be considered as the positive electrode material of an all-solid-state thin-film lithium ion secondary battery. $LiCoO_2$ is known to have higher resistivity due to an oxygen defect. When this kind of target is prepared via pressureless sintering in an atmosphere or an oxygen atmosphere, the resistivity can be lowered to be 3 kΩ·cm or less by adjusting the powder conditions and the sintering conditions (refer to Patent Documents 2 and 3). But if the sintering temperature is increased (for example, 1150° C. or higher) to achieve higher densification, the resistivity will increase to 100 kΩcm or more. Moreover, when this kind of target is prepared via pressure sintering such as hot press or hot isostatic press (HIP) capable of easily achieving higher densification, the density can be increased higher in comparison to pressureless sintering, but the resistivity will be 1 kΩcm or more since this process is normally performed in a reduction atmosphere, and this was not suitable for use in DC sputtering.

Under the foregoing circumstances, the sputtering target of the present invention is characterized in that it has a composition of $LiCoO_2$, the average resistivity of the target surface (measured with four-terminal method) is 100 Ωcm or less, the relative density (theoretical density: 5.15 g/cm³) is 80% or higher. Consequently, the sputtering target of the present invention can be subject to DC sputtering which is capable of high speed deposition, and can form a uniform positive electrode thin film since generation of abnormal discharge (arcing) during deposition is minimal due to the target having high density. Moreover, the present invention can cause the average resistivity of the sputtering target surface (measured with four-terminal method) to be 50 Ωcm or less, and the relative density to be 85% or higher. This enables even more efficient DC sputtering.

The average resistivity of the target surface is obtained, as shown in FIG. 1, by measuring the resistivity at each of the following points; namely, 1 point at the center, 4 points at ½ of the radius, and 4 points on the circumference 10 mm inward from the outer periphery of a disk-shaped (plate-shaped) target, and obtaining the average value thereof. Meanwhile, with a cylindrical target, as shown in FIG. 2, measurement is performed on the outer surface of the cylindrical target, and the average resistivity of the target surface is obtained by measuring the resistivity at each of the following points; namely, on 4 lines extended parallel in length direction of the cylinder from the points of quartering the circumference of the cylinder, 4 points at 5 mm from one end of the cylinder, 4 points at the middle of the lines in the length direction, and 4 points at 5 mm from the other end of the cylinder; and obtaining the average value thereof.

The $LiCoO_2$ sputtering target of the present invention is characterized in that the in-plane maximum resistivity of the target is not greater than double the average resistivity of the target surface. Here, the term "maximum resistivity" refers to the maximum value among the individual resistivity values measured when calculating the foregoing average value. This means that the variation in the resistivity is small and the resistivity is uniform in the in-plane direction of the target. Moreover, the sputtering target of the present invention is characterized in that when the average resistivity in a cross section corresponding to half the thickness of the target is measured in the same manner as described above, the value thereof is not greater than double the average resistivity of the target surface. In other words, this means that the variation in the resistivity is small and the resistivity is uniform in the thickness direction of the target. Extremely stable DC sputtering is possible when the resistivity is uniform in the in-plane direction and thickness direction of the sputtering target as described above.

The $LiCoO_2$ sputtering target of the present invention can be prepared as follows. Foremost, a raw material powder based on a lithium source and a raw material powder based on a cobalt source are weighed and mixed to achieve a Li:Co ratio of 1:1 or an intended composition, and thereafter subject to heat treatment at 700° C. to 850° C. in an atmosphere or an oxygen atmosphere to synthesize $LiCoO_2$. As the lithium source, for instance, lithium carbonate, lithium hydroxide, lithium oxide or the like may be used. Meanwhile, as the cobalt source, for instance, various cobalt oxides ($CoO$, $Co_2O_3$, $Co_3O_4$ and the like), cobalt carbonate, cobalt nitrate, cobalt oxalate or the like may be used. Next, the synthesized $LiCoO_2$ is pulverized. Here, when wet pulverization using deionized water is performed, Li in the $LiCoO_2$ becomes eluted and may cause a compositional deviation. Thus, it is desirable to perform dry pulverization. Meanwhile, if wet pulverization is adopted along with a drying method such as spray-drying slurry in which a compositional deviation does not occur easily, wet pulverization is also effective. Note that the method of producing a $LiCoO_2$ powder is not limited to the foregoing method, and commercially available $LiCoO_2$ powder may also be used.

Next, the thus prepared $LiCoO_2$ (lithium cobalt oxide) powder is hot pressed at a temperature of 600 to 950° C. to prepare a sintered compact, and the prepared sintered compact is thereafter subject to heat treatment at a temperature of 950° C. to 1150° C. in an atmosphere or an oxygen atmosphere. Subsequently, the resultant product is machined into a target shape to prepare a sputtering target. When the heat treatment temperature exceeds 1150° C., a reaction involving the decomposition of $LiCoO_2$ will advance drastically, and therefore, it is not possible to obtain a low resistivity even when adopting the foregoing oxygen supplying method. In addition to hot press sintering, the $LiCoO_2$ (lithium cobalt oxide) powder may be subject to the uniaxial pressing method using a metal mold, or the cold isostatic press (CIP) method using a rubber mold, or a combination thereof, and the thus prepared molded article may be subject to heat treatment at a temperature of 950 to 1150° C. in an atmosphere or an oxygen atmosphere to prepare a plate-shaped sputtering target, or a cylindrical sputtering target which is particularly effective.

With $LiCoO_2$, it is known that oxygen becomes separated in a high temperature heat treatment to increase the resistivity. Accordingly, in order to prepare a sintered compact having low resistivity, it is necessary to suppress the separation of oxygen as much as possible during the sintering process, and a lower sintering temperature is desirable. Meanwhile, when being used as a sputtering target, a high density sintered compact is demanded for the purpose of inhibiting the generation of particles, but in order to achieve higher densification, sintering at a higher temperature is required. As described above, there are contradictory characteristics from the perspective of the sintering temperature; namely, lowering of the resistivity and higher densification of the sintered compact. Specifically, high densification can be achieved by performing sintering within a temperature range of 950° C. to 1150° C., but there is a problem in that the internal resistance of the sintered compact increases. As a result of intense study to resolve the foregoing problem, the present inventors succeeded in uniformly lowering the resistivity not only in the plane direction of the sintered compact, but also in the thickness direction, by performing sintering (heat treatment) at a temperature of 950° C. or lower as a preliminary step before high densification at 950° C. to 1150° C.

Also, the foregoing principle can be explained as follows. When sintering is preformed via hot press that is generally performed using a carbon-based die, hot press is performed in a vacuum or a reduction atmosphere such as an argon atmosphere, and therefore, separation of oxygen from $LiCoO_2$ is promoted and the resistivity of the sintered compact becomes extremely high. Meanwhile, even if heat treatment is subsequently performed in an atmosphere or an oxygen atmosphere at a temperature that is higher than the sintering temperature in order to lower the resistivity, when high densification has already been achieved, penetrant diffusion of oxygen inward the sintered compact was not sufficiently achieved and the internal resistivity of the sintered compact remains high. Nevertheless, when hot press is performed at a temperature of 950° C. or less, the sintered compact is in a state prior to the high densification, and therefore, it is considered that the dispersion of oxygen is promoted in the subsequent heat treatment performed in an atmosphere or an oxygen atmosphere and lowering of the internal resistivity is also promoted. Furthermore, by repeating the processes of heating at a temperature that is lower than the final heat treatment temperature, and cooling, oxygen permeates further inside the sintered compact, and the uniformity of resistivity will increase.

When molding is performed via CIP, it is anticipated that the problem of the separation of oxygen, which occurs in hot press, will not arise by performing heat treatment (sintering) in an atmosphere or an oxygen atmosphere from the initial stage of sintering. Nevertheless, in effect, it was confirmed that the internal resistivity of the target will increase. This is considered to be a result of the following. In other words, in the case of CIP molding, a binder is normally added to increase the moldability, but the inside of the sintered compact will be filled with the vaporized binder component during the sintering process, and a state of oxygen deficiency will temporarily arise. Here, oxygen separation occurs and a reduction state as in hot press is formed. When sintering is advanced in the foregoing state, the surface of the sintered compact will be of low resistivity since, after the vaporization of the binder is completed, the dispersion of oxygen from the outside is started. Nevertheless, sufficient oxygen is not supplied to the inside of the sintered compact, and the inside of the sintered compact will be of high resistivity. Accordingly, sintering is performed at a temperature that is higher than the temperature at which the vaporization of the binder is completed but not higher than 950° C. in which high densification will advance, and the sintered compact is thereafter cooled once. Thereby, oxygen is sufficiently supplied inside the sintered compact, and low resistivity can be achieved up to the inside of the sintered compact. Furthermore, by repeating the processes of heating at 950° C. or lower and cooling, it becomes possible to supply oxygen further inside the sintered compact, and the effect of even more uniformization can be expected.

EXAMPLES

The present invention is now explained with reference to the Examples and Comparative Examples. Note that these Examples are merely illustrative, and the present invention shall in no way be limited thereby. In other words, various modifications and other embodiments are covered by the present invention, and the present invention is limited only by the scope of its claims.

Example 1

After weighing a lithium carbonate powder and a cobalt oxide powder as the raw materials to achieve Li:Co=1.01:1, the raw material powders were pulverized and mixed in a dry ball mill, and the resultant mixed powder was subject to heat treatment at 850° C. in an atmosphere to synthesize $LiCoO_2$. Next, the thus synthesized $LiCoO_2$ was subject to dry pulverization in a jet mill to obtain a $LiCoO_2$ powder. As a result of analyzing the obtained $LiCoO_2$ powder using an X-ray diffraction (XRD) device, it was confirmed that the $LiCoO_2$ powder is configured from a $LiCoO_2$ single phase. Next, the $LiCoO_2$ powder was hot pressed at 950° C. for 1 hour at a contact pressure of 150 k $g/cm^2$. The resultant product was thereafter subject to heat treatment at 950° C. in an atmosphere for 10 hours, subsequently cooled to room temperature, and thereafter subject to heat treatment at 1050° C. for 10 hours. A $LiCoO_2$ sintered compact was thereby obtained.

As a result of analyzing the obtained sintered compact using an X-ray diffraction (XRD) device, it was confirmed that the sintered compact is configured from a $LiCoO_2$ single phase. Moreover, the relative density of the sintered compact was 90% on the condition that the theoretical density is 5.15 $g/cm^3$. Next, the surface of the sintered compact was subject to cutting in a depth of 2 mm and processed into a sputtering target having a diameter of 6 inches and a thickness of 5 mm. An extremely high resistance region was confirmed at a 50 mm width from the outer periphery by measurement of the resistivity of the target surface. This section was cut off during the processing of the target. As a result of measuring the resistance value at a total of 9 points on the target surface (1 point at the center, 4 points at ½ of the radius, and 4 points on the circumference [2] 10 mm inward from the outer periphery), the average resistivity was 40 $\Omega cm$, and the in-plane maximum resistivity of the target was 60 Ωcm, and was not greater than double the average resistivity of the target surface.

When the target was mounted in sputtering equipment to perform sputtering, DC sputtering was possible, and stable deposition was realized without generation of arcing. Next, after cutting the target from the sputter surface side to achieve a thickness of 2.5 mm, the resistance value at 9 points on the cut surface was measured in the same manner as described above. Consequently, the average resistivity (internal resistivity) was 60 Ωcm, and was not greater than double the average resistivity of the target surface.

Example 2

After weighing a lithium hydroxide powder and a cobalt oxide powder as the raw materials to achieve Li:Co=1.01:1, the raw material powders were pulverized and mixed in a dry ball mill, and the resultant mixed powder was subject to heat treatment at 850° C. in an atmosphere to synthesize $LiCoO_2$. Next, the thus synthesized $LiCoO_2$ was subject to dry pulverization in a jet mill to obtain a $LiCoO_2$ powder. As a result of analyzing the obtained $LiCoO_2$ powder using an X-ray diffraction (XRD) device, it was confirmed that the $LiCoO_2$ powder is configured from a $LiCoO_2$ single phase. Next, the mixed powder was hot pressed at 700° C. for 1 hour at a contact pressure of 150 k g/cm². The resultant product was thereafter subject to heat treatment at 1050° C. in an atmosphere for 10 hours. A $LiCoO_2$ sintered compact was thereby obtained.

As a result of analyzing the obtained sintered compact using an X-ray diffraction (XRD) device, it was confirmed that the sintered compact is configured from a $LiCoO_2$ single phase. Moreover, the relative density of the sintered compact was 85% on the condition that the theoretical density is 5.15 g/cm³. Next, the surface of the sintered compact was subject to cutting in a depth of 2 mm and processed into a sputtering target having a diameter of 6 inches and a thickness of 5 mm. As a result of measuring the resistivity of the target surface at 9 points in the same manner as Example 1, the average resistivity was 50 Ωcm, and the in-plane maximum resistivity of the target was 75 Ωcm, and was not greater than double the average resistivity of the target surface. Note that a high resistance region was not confirmed at the outer periphery.

When the target was mounted in sputtering equipment to perform sputtering, DC sputtering was possible, and stable deposition was realized without generation of arcing. Next, after cutting the target from the sputter surface side to achieve a thickness of 2.5 mm, the resistance value at 9 points on the cut surface was measured in the same manner as described above. Consequently, the average resistivity (internal resistivity) was 85 Ωcm, and was not greater than double the average resistivity of the target surface.

Example 3

After weighing a lithium oxide powder and a cobalt oxide powder as the raw materials to achieve Li:Co=1.01:1, the raw material powders were pulverized and mixed in a dry ball mill, and the resultant mixed powder was subject to heat treatment at 850° C. in an atmosphere to simultaneously undergo sintering and synthesis. The resultant product was thereafter subject to heat treatment at 1050° C. in an oxygen atmosphere for 10 hours to obtain a $LiCoO_2$ sintered compact.

As a result of analyzing the obtained sintered compact using an X-ray diffraction (XRD) device, it was confirmed that the sintered compact is configured from a $LiCoO_2$ single phase. Moreover, the relative density of the sintered compact was 88% on the condition that the theoretical density is 5.15 g/cm³. Next, the surface of the sintered compact was subject to cutting in a depth of 2 mm and processed into a sputtering target having a diameter of 6 inches and a thickness of 5 mm. An extremely high resistance region was confirmed at a 50 mm width from the outer periphery by measurement of the resistivity of the target surface. This section was cut off during the processing of the target. Subsequently, as a result of measuring the resistivity of the target surface at 9 points in the same manner as Example 1, the average resistivity was 20 Ωcm, and the in-plane maximum resistivity of the target was 35 Ωcm, and was not greater than double the average resistivity of the target surface.

When the target was mounted in sputtering equipment to perform sputtering, DC sputtering was possible, and stable deposition was realized without generation of arcing. Next, after cutting the target from the sputter surface side to achieve a thickness of 2.5 mm, the resistance value at 9 points on the cut surface was measured in the same manner as described above. Consequently, the average resistivity (internal resistivity) was 35 Ωcm, and was not greater than double the average resistivity of the target surface.

Example 4

Commercially available lithium cobalt oxide (CELL-SEED C5H manufactured by Nippon Chemical Industrial Company) was used as the raw material, and this commercially available powder was hot pressed at 950° C. The resultant product was thereafter subject to heat treatment at 1000° C. in an oxygen atmosphere for 10 hours to obtain a $LiCoO_2$ sintered compact.

As a result of analyzing the obtained sintered compact using an X-ray diffraction (XRD) device, it was confirmed that the sintered compact is configured from a $LiCoO_2$ single phase. Moreover, the relative density of the sintered compact was 89% on the condition that the theoretical density is 5.15 g/cm³. Next, the surface of the sintered compact was subject to cutting in a depth of 2 mm and processed into a sputtering target having a diameter of 6 inches and a thickness of 5 mm. As a result of measuring the resistivity of the target surface at 9 points in the same manner as Example 1, the average resistivity was 30 Ωcm, and the in-plane maximum resistivity of the target was 45 Ωcm, and was not greater than double the average resistivity of the target surface. Note that a high resistance region was confirmed at a 70 mm width from the outer periphery. This section was cut off during the processing of the target.

When the target was mounted in sputtering equipment to perform sputtering, DC sputtering was possible, and stable deposition was realized without generation of arcing. Next, after cutting the target from the sputter surface side to achieve a thickness of 2.5 mm, the resistance value at 9 points on the cut surface was measured in the same manner as described above. Consequently, the average resistivity (internal resistivity) was 50 Ωcm, and was not greater than double the average resistivity of the target surface.

Example 5

Commercially available lithium cobalt oxide (CELL-SEED C5H manufactured by Nippon Chemical Industrial Company) was used as the raw material, and this commercially available powder was hot pressed at 800° C. The resultant product was thereafter subject to heat treatment at 800° C. in an oxygen atmosphere for 10 hours, subsequently cooled to room temperature, and thereafter subject to heat treatment at 1100° C. for 10 hours. A LiCoO$_2$ sintered compact was thereby obtained.

As a result of analyzing the obtained sintered compact using an X-ray diffraction (XRD) device, it was confirmed that the sintered compact is configured from a LiCoO$_2$ single phase. Moreover, the relative density of the sintered compact was 90% on the condition that the theoretical density is 5.15 g/cm$^3$. Next, the surface of the sintered compact was subject to cutting in a depth of 2 mm and processed into a sputtering target having a diameter of 6 inches and a thickness of 5 mm. As a result of measuring the resistivity of the target surface at 9 points in the same manner as Example 1, the average resistivity was 35 Ωcm, and the in-plane maximum resistivity was 45 Ωcm, and was not greater than double the average resistivity of the target surface. Note that a high resistance region was confirmed at a 30 mm width from the outer periphery. This section was cut off during the processing of the target.

When the target was mounted in sputtering equipment to perform sputtering, DC sputtering was possible, and stable deposition was realized without generation of arcing. Next, after cutting the target from the sputter surface side to achieve a thickness of 2.5 mm, the resistance value at 9 points on the cut surface was measured in the same manner as described above. Consequently, the average resistivity (internal resistivity) was 40 Ωcm, and was not greater than double the average resistivity of the target surface. When heat treatment was repeatedly performed in an oxygen atmosphere, improvement in the resistivity distribution in the thickness direction of the target was observed.

Example 6

Commercially available lithium cobalt oxide (CELL-SEED C5H manufactured by Nippon Chemical Industrial Company) was used as the raw material, and this commercially available powder was pulverized in a jet mill. Next, PVA was added as a binder to the pulverized powder, the obtained powder was sieved and thereafter subject to uniaxial pressing with a metal mold, and it was subsequently subject to cold isostatic press to be molded into a disk shape. Next, the molded article was subject to heat treatment at 500° C. in an oxygen atmosphere for 10 hours, subsequently cooled to room temperature, and thereafter subject to heat treatment at 1050° C. for 10 hours. A disk-shaped LiCoO$_2$ sintered compact was thereby obtained.

As a result of analyzing the obtained sintered compact using an X-ray diffraction (XRD) device, it was confirmed that the sintered compact is configured from a LiCoO$_2$ single phase. Moreover, the relative density of the sintered compact was 85% on the condition that the theoretical density is 5.15 g/cm$^3$. Next, the surface of the sintered compact was subject to cutting in a depth of 2 mm and processed into a sputtering target having a diameter of 6 inches and a thickness of 5 mm. As a result of measuring the resistivity of the target surface at 9 points in the same manner as Example 1, the average resistivity was 25 Ωcm, and the in-plane maximum resistivity of the target was 35 Ωcm, and was not greater than double the average resistivity of the target surface. Note that a high resistance region was not confirmed at the outer periphery.

Next, the sintered compact was processed into a sputtering target having a diameter of 6 inches and a thickness of 5 mm. When the target was mounted in sputtering equipment to perform sputtering, DC sputtering was possible, and stable deposition was realized without generation of arcing. Next, after cutting the target from the sputter surface side to achieve a thickness of 2.5 mm, the resistance value at 9 points on the cut surface was measured in the same manner as described above. Consequently, the average resistivity (internal resistivity) was 33 Ωcm, and was not greater than double the average resistivity of the target surface.

Example 7

Commercially available lithium cobalt oxide (CELL-SEED C5H manufactured by Nippon Chemical Industrial Company) was used as the raw material, and this commercially available powder was pulverized in a jet mill. Next, PVA was added as a binder to the pulverized powder, and the obtained powder was sieved and thereafter subject to cold isostatic press to be molded into a cylindrical shape. The molded article was thereafter subject to heat treatment at 500° C. in an oxygen atmosphere for 10 hours, subsequently cooled to room temperature, and thereafter subject to heat treatment at 1050° C. in an oxygen atmosphere for 10 hours. A cylindrical LiCoO$_2$ sintered compact was thereby obtained (outer diameter of 50 mmφ, inner diameter of 30 mmφ, height of 80 mm).

As a result of analyzing the obtained sintered compact using an X-ray diffraction (XRD) device, it was confirmed that the sintered compact is configured from a LiCoO$_2$ single phase. Moreover, the relative density of the sintered compact was 83% on the condition that the theoretical density is 5.15 g/cm$^3$. Next, the surface of the sintered compact was subject to cutting in a depth of 2 mm. As a result of thereafter measuring the resistivity of the surface of the sintered compact at a total of 12 points; specifically, 4 points equiangularly in the circumferential direction at 5 mm from each end and in the middle of the cylindrical sintered compact, the average resistivity was 40 Ωcm, and the in-plane maximum resistivity of the cylinder was 55 Ωcm, and was not greater than double the average resistivity of the target surface. Note that a high resistance region was not confirmed at the outer periphery.

Comparative Example 1

Commercially available lithium cobalt oxide (CELL-SEED C5H manufactured by Nippon Chemical Industrial Company) was used as the raw material, and this commercially available powder was hot pressed at 950° C. to obtain a LiCoO$_2$ sintered compact. Note that heat treatment was not subsequently performed. The relative density of the sintered compact was 88% on the condition that the theoretical density is 5.15 g/cm$^3$. Next, the surface of the sintered compact was subject to cutting in a depth of 2 mm and processed into a sputtering target having a diameter of 6 inches and a thickness of 5 mm. As a result of measuring the resistivity of the target surface at 9 points in the same manner as Example 1, the average resistivity exceeded 500 kΩcm and was unmeasurable. Next, the target was mounted in sputtering equipment to perform sputtering, but DC sputtering was not possible.

Comparative Example 2

Commercially available lithium cobalt oxide (CELL-SEED C5H manufactured by Nippon Chemical Industrial Company) was used as the raw material, and this commercially available powder was hot pressed at 1000° C., and thereafter subject to heat treatment at 1050° C. in an oxygen atmosphere for 10 hours to obtain a LiCoO$_2$ sintered compact. The relative density of the sintered compact was 95% on the condition that the theoretical density is 5.15 g/cm$^3$. Next, the surface of the sintered compact was subject to cutting in a depth of 2 mm and processed into a sputtering target having a diameter of 6 inches and a thickness of 5 mm. As a result of measuring the resistivity of the target surface at 9 points in the same manner as Example 1, the average resistivity exceeded 500 kΩcm and was unmeasurable. Next, the target was mounted in sputtering equipment to perform sputtering, but DC sputtering was not possible.

Comparative Example 3

Commercially available lithium cobalt oxide (CELL-SEED C5H manufactured by Nippon Chemical Industrial Company) was used as the raw material, and this commercially available powder was hot pressed at 700° C., and thereafter subject to heat treatment at 900° C. in an oxygen atmosphere for 10 hours to obtain a LiCoO$_2$ sintered compact. The relative density of the sintered compact was 71% on the condition that the theoretical density is 5.15 g/cm$^3$. Next, the surface of the sintered compact was subject to cutting in a depth of 2 mm and processed into a sputtering target having a diameter of 6 inches and a thickness of 5 mm. As a result of measuring the resistivity of the target surface at 9 points in the same manner as Example 1, the average resistivity was 200 kΩcm, and sufficient decrease in the resistivity could not be observed. Next, the target was mounted in sputtering equipment to perform sputtering, but DC sputtering was not possible. The foregoing results are summarized in Table 1.

TABLE 1

| | Raw material | Press method | Press temperature | Heat treatment temperature | Heat treatment atmosphere | Density | Surface resistivity | Maximum resistivity | Internal resistivity |
|---|---|---|---|---|---|---|---|---|---|
| Example 1 | Li$_2$Co$_3$ + Co$_2$O$_3$ | Hot press | 950° C. | 950° C. | 1050° C. Atmosphere | 90% | 40 Ωcm | 60 Ωcm | 60 Ωcm |
| Example 2 | LiOH + Co$_2$O$_3$ | Hot press | 700° C. | — | 1050° C. Atmosphere | 85% | 50 Ωcm | 75 Ωcm | 85 Ωcm |
| Example 3 | Li$_2$O + Co$_2$O$_3$ | Hot press | 850° C. | — | 1050° C. Oxygen | 88% | 20 Ωcm | 35 Ωcm | 35 Ωcm |
| Example 4 | LiCoO$_2$ | Hot press | 950° C. | — | 1000° C. Oxygen | 89% | 30 Ωcm | 45 Ωcm | 50 Ωcm |
| Example 5 | LiCoO$_2$ | Hot press | 800° C. | 800° C. | 1100° C. Oxygen | 90% | 35 Ωcm | 45 Ωcm | 40 Ωcm |
| Example 6 | LiCoO$_2$ | CIP (oxygen atmosphere, ordinary pressure) | — | 500° C. | 1050° C. Oxygen | 85% | 25 Ωcm | 35 Ωcm | 33 Ωcm |
| Example 7 | LiCoO$_2$ | CIP (oxygen atmosphere, ordinary pressure) | — | 500° C. | 1050° C. Oxygen | 83% | 40 Ωcm | 55 Ωcm | 45 Ωcm |
| Comparative Example 1 | LiCoO$_2$ | Hot press | 950° C. | — | — — | 88% | exceeding 500 KΩcm | — | — |
| Comparative Example 2 | LiCoO$_2$ | Hot press | 1000° C. | — | 1050° C. Oxygen | 95% | exceeding 500 KΩcm | — | — |
| Comparative Example 3 | LiCoO$_2$ | Hot press | 950° C. | — | 1200° C. Oxygen | 95% | exceeding 500 KΩcm | — | — |
| Comparative Example 4 | LiCoO$_2$ | Hot press | 700° C. | — | 900° C. Oxygen | 71% | 2 kΩcm | — | — |

Company) was used as the raw material, and this commercially available powder was hot pressed at 950° C., and thereafter subject to heat treatment at 1200° C. in an oxygen atmosphere for 10 hours to obtain a LiCoO$_2$ sintered compact. The relative density of the sintered compact was 95% on the condition that the theoretical density is 5.15 g/cm$^3$. Next, the surface of the sintered compact was subject to cutting in a depth of 2 mm and processed into a sputtering target having a diameter of 6 inches and a thickness of 5 mm. As a result of measuring the resistivity of the target surface at 9 points in the same manner as Example 1, the average resistivity exceeded 500 kΩcm and was unmeasurable. Next, the target was mounted in sputtering equipment to perform sputtering, but DC sputtering was not possible.

Comparative Example 4

Commercially available lithium cobalt oxide (CELL-SEED C5H manufactured by Nippon Chemical Industrial Since the sputtering target for forming a positive electrode thin film of the present invention has a low resistivity and can be subject to DC sputtering, it is possible to deposit a uniform positive electrode thin film at a high speed. Moreover, since the sputtering target of the present invention has a high density, there is minimal generation of abnormal discharge (arcing) during deposition, and it is possible to thereby deposit a uniform positive electrode thin film. Furthermore, all-solid-state thin-film lithium ion secondary batteries with this kind of positive electrode thin film yield an effect of being able to obtain stable charging/discharging characteristics. The sputtering target of the present invention is effective for depositing a solid electrolyte thin film of lithium ion secondary batteries; and particularly effective for depositing a solid electrolyte thin film in lithium ion secondary batteries equipped in vehicles, information and communication electronics, household appliances, and the like.

The invention claimed is:

1. A LiCoO$_2$ sputtering target having a composition configured from a LiCoO$_2$ single phase, wherein the LiCoO$_2$ sputtering target is a cylinder and a sputtering face of the LiCoO$_2$ sputtering target is an outer peripheral surface of the cylinder, and wherein an average resistivity of the outer peripheral surface is 50 Ωcm or less, a relative density of the $LiCoO_2$ sputtering target is 83% or higher, an average resistivity of a position corresponding to half a thickness of a cylindrical wall of the $LiCoO_2$ sputtering target is not greater than double the average resistivity of the outer peripheral surface, and an in-plane maximum resistivity of the $LiCoO_2$ sputtering target is not greater than double the average resistivity of the outer peripheral surface, the average resistivity being an average value of measurements of resistivity at twelve points on the outer peripheral surface including four points equiangularly in a circumferential direction of the cylinder at 5 mm spacing from an end of the cylinder, four points equiangularly in a circumferential direction of the cylinder at 5 mm spacing from an opposite end of the cylinder, and four points equiangularly in a circumferential direction of the cylinder at a mid-length of the cylinder.

2. A method of producing the $LiCoO_2$ sputtering target according to claim 1, comprising subjecting a lithium cobalt oxide powder to cold isostatic press to be molded into a cylindrical shape, and thereafter repeatedly performing heat treatment to the resultant molded article in an atmosphere or in an oxygen atmosphere two or more times to produce a cylindrical target, wherein temperature of final heat treatment is set to be 950 to 1150° C., temperature of any preceding heat treatment is set to be a temperature that is not higher than the temperature of the final heat treatment, and a process of cooling to a room temperature is provided between the respective heat treatment processes.

3. The $LiCoO_2$ sputtering target according to claim 1, wherein the relative density is 85% or higher.

* * * * *